United States Patent
Fujita et al.

(10) Patent No.: US 6,887,643 B2
(45) Date of Patent: May 3, 2005

(54) PHOTOSENSITIVE RESIN PRECURSOR COMPOSITION

(75) Inventors: Yoji Fujita, Otsu (JP); Mitsuhito Suwa, Otsu (JP); Masao Tomikawa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 10/623,680

(22) Filed: Jul. 22, 2003

(65) Prior Publication Data

US 2004/0053156 A1 Mar. 18, 2004

(30) Foreign Application Priority Data

Aug. 5, 2002 (JP) .......... 2002-227178

(51) Int. Cl.$^7$ .......... G03F 7/023; G03F 7/30
(52) U.S. Cl. .......... 430/191; 430/192; 430/193; 430/270.1; 430/907
(58) Field of Search .......... 430/191, 192, 430/193, 270.1, 907, 189

(56) References Cited

U.S. PATENT DOCUMENTS

| | | | | |
|---|---|---|---|---|
| 4,636,532 A | * | 1/1987 | Sandford | 522/3 |
| 5,449,584 A | * | 9/1995 | Banba et al. | 430/190 |
| 5,571,642 A | * | 11/1996 | Wakata et al. | 430/7 |
| 6,071,666 A | * | 6/2000 | Hirano et al. | 430/191 |
| 6,436,593 B1 | * | 8/2002 | Minegishi et al. | 430/18 |
| 6,576,381 B1 | * | 6/2003 | Hirano et al. | 430/11 |
| 6,607,865 B1 | * | 8/2003 | Makabe et al. | 430/191 |

FOREIGN PATENT DOCUMENTS

| | | |
|---|---|---|
| EP | 1 209 523 | 5/2002 |
| JP | 2001 249452 | 9/2001 |
| KR | 2002 055 837 | 7/2002 |

* cited by examiner

*Primary Examiner*—John S. Chu
(74) *Attorney, Agent, or Firm*—Morrison & Foerster LLP

(57) ABSTRACT

A photosensitive resin precursor composition exhibiting an excellent film thickness uniformity contains: a heat resistant resin precursor polymer; a radiation sensitive compound; and a solvent expressed by formula (1):

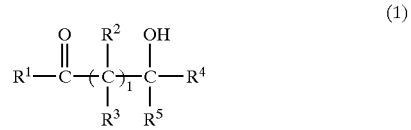

(1)

$R^1$ represents an alkyl group having a carbon number in the range of 1 to 3. $R^2$, $R^3$, $R^4$, and $R^5$ each represent hydrogen or an alkyl group having a carbon number in the range of 1 to 3, and l represents an integer in the range of 0 to 3.

12 Claims, No Drawings

PHOTOSENSITIVE RESIN PRECURSOR COMPOSITION

BACKGROUND OF THE INVENTION

1. Field of the Invention

The present invention relates to a photosensitive resistant resin precursor composition having an excellent film thickness uniformity and which is suitably used for a surface protection layer and an insulating interlayer of a semiconductor element, an insulating layer of an organic electroluminescent device, and the like.

2. Description of the Related Art

For the surface protection layer and insulating interlayer of semiconductor elements, a heat resistant polyimide resin having excellent electric characteristics and mechanical characteristics has been used. On the other hand, a technique of giving photosensitivity to a polyimide resin precursor composition has been of interest from the viewpoint of simplification of a patterning operation, reduction of process steps, and increase of yields. Also, a positive photosensitive resin precursor composition capable of being developed with an alkaline solution has recently been developed form the viewpoint of safety, ease of handling, and environmental concerns.

In general, to form a film, these photosensitive resin precursor compositions are applied onto a substrate, such as a silicon wafer or glass, by spin coating and heated to evaporate the solvent. Good solvents, such as N-methyl-2-pyrrolidone and γ-butyrolactone, are generally used as the solvent in this operation. However, since these solvents have a boiling point as high as 200° C. or more, they are difficult to vaporize during spin coating, and they must be heated to vaporize rapidly. Consequently, it is difficult to form a film having a uniform thickness. The use of a solvent easy to vaporize disadvantageously results in precipitation of foreign matter because the solvent cannot dissolve the resin well, or causes striation during spin coating even if the solvent dissolve the resin.

A use of diacetone alcohol for a cresol novolac resin has been disclosed in Japanese Unexamined Patent Application Publication No. 7-128848. However, since heat resistant resin precursors epitomized by a polyimide resin precursor have low solubilities in solvents by nature, they cannot be satisfactorily dissolved even in diacetone alcohol.

SUMMARY OF THE INVENTION

Accordingly, an object of the present invention is to provide a photosensitive resin precursor composition exhibiting excellent film thickness uniformity without precipitation of foreign matter.

According to an aspect of the present invention, a photosensitive resin precursor composition is provided which comprises: (a) a heat resistant resin precursor polymer; (b) a radiation sensitive compound; and (c) a solvent expressed by formula (1):

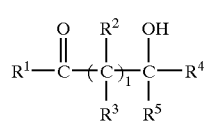

(1)

In the formula, $R^1$ represents an alkyl group having a carbon number in the range of 1 to 3. $R^2$, $R^3$, $R^4$, and $R^5$ each represent hydrogen or an alkyl group having a carbon number in the range of 1 to 3, and l represents an integer in the range of 0 to 3.

According to the present invention, the resulting photosensitive resin precursor composition can be developed with an alkaline solution and exhibit excellent film thickness uniformity without precipitation of foreign matter.

DESCRIPTION OF THE PREFERRED EMBODIMENTS

A heat resistant resin precursor polymer of the present invention is formed to a ring structure, such as an imide ring, an oxazole ring, or a thiazole ring by heating or with an adequate catalyst, thereby resulting in a heat resistant resin. The ring structure increases the heat resistance and solvent resistance of the resulting resin. Preferably, the heat resistant resin precursor polymer is polyamic acid or polyamic ester, which are a polyimide precursor, or polyhydroxyamide, which is a polybenzoxazole precursor, but it is not limited to these. For a positive photosensitivity, preferably, the heat resistant resin precursor polymer is essentially composed of a structural unit expressed by general formula (3). For a negative photosensitivity, preferably, the polymer is essentially composed of a structure unit expressed by general formula (4).

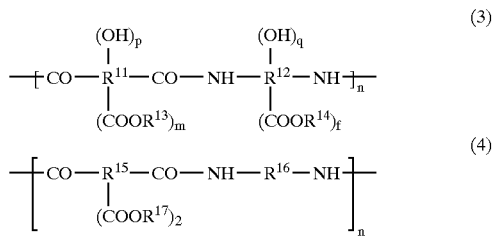

Formula (3) expresses a polyamic acid having a hydroxy group. The hydroxy group increases the solubility of the polymer in an alkaline developer to be higher than that of other polyamic acids having no hydroxy group. In particular, the hydroxy group is preferably phenolic from the viewpoint of the increase of the solubility in alkaline developers. Also, the presence of 10 percent by weight or more of fluorine in formula (3) increases the repellency of the interface of the film to some extent, and, thereby, prevents an alkaline developer from penetrating into the interface. Unfortunately, a fluorine content of more than 20 percent by weight leads to reduced solubilities in alkaline developers and fuming nitric acid and causes the resistance to organic solvents of the polymer formed to a ring structure by heat treatment to deteriorate. Accordingly, the fluorine content is preferably set in the range of 10 to 20 percent by weight.

In formula (3), $R^{11}$ represents a structural constituent of an acid dianhydride or a dicarboxylic acid, and is preferably an organic group having a valence in the range of 2 to 8 and a carbon number of at least 2, containing an aromatic group and one to four hydroxy groups. More preferably, the carbon number is in the range of 6 to 30 and the valence is 3 or 4.

Specifically, it is preferable that $R^{11}$ be expressed by general formula (5). Preferably, $R^{18}$ and $R^{20}$ each have an aromatic group from the viewpoint of the heat resistance of the resulting polymer. In particular, residues of trimellitic acid, trimesic acid, naphthalenetricarboxylic acid, and the like are preferable. Preferably, $R^{19}$ is an organic group having a valence in the range of 3 to 6 and a carbon number in the range of 3 to 20, containing a hydroxy group. Preferably, the hydroxy group is adjacent to an amide bond. Such $R^{19}$ may be fluorine-containing bis(3-amino-4-hydroxyphenyl)hexafluoropropane or bis(3-hydroxy-4-aminophenyl)hexafluoropropane, or fluorine-free bis(3-amino-4-hydroxyphenyl)propane, bis(3-hydroxy-4-aminophenyl)propane, 3,3'-diamino-4,4'-dihydroxybiphenyl, 3,3'-dihydroxy-4,4'-diaminobiphenyl, 2,4-diaminophenol, 2,5-diaminophenol, or 1,4-diamino-2,5-dihydroxybenzene whose amino group is bonded.

For $R^{21}$ and $R^{22}$, hydrogen and organic groups having a carbon number in the range of 1 to 20 are suitable and they may be the same or different. A carbon number of more than 20 leads to a reduced solubilities in alkaline developers. Variables o and s each represent an integer of 1 or 2 and variable r represents an integer in the range of 1 to 4. A variable r of 5 or more negatively affects characteristics of the resulting heat resistant resin film.

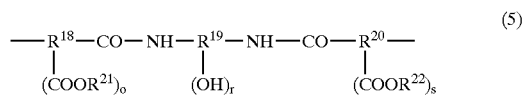

(5)

The $R^{11}(COOR^{13})_m(OH)_p$ structure in formula (3) may be expressed by formula (5) and preferred compounds are shown below, but they are not limited to these.

These compounds may be modified with a tetracarboxylic acid or dicarboxylic acid having no hydroxy group unless the solubility in alkaline developers, photosensitivity, and heat resistance are negatively affected. Such tetracarboxylic and dicarboxylic acids include: aromatic tetracarboxylic acids, such as pyromellitic acid, benzophenonetetracarboxylic acid, biphenyltetracarboxylic acid, diphenylethertetracarboxylic acid, and diphenylsulfonetetracarboxylic acid, and diester compounds in which two carboxyl groups of these aromatic carboxylic acids are formed to a methyl or ethyl group; aliphatic tetracarboxylic acids, such as butanetetracarboxylic acid and cyclopentanetetracarboxylic acid, and diester compounds in which two carboxyl groups of these aliphatic carboxylic acids are formed to a methyl or ethyl group; aromatic dicarboxylic acids, such as terephthalic acid, isophthalic acid, diphenyletherdicarboxylic acid, and naphthalenedicarboxylic acid; and aliphatic dicarboxylic acids, such as adipic acid. Preferably, the modification is performed on 50 mol % or less of the acid component, and more preferably on 30 mol % or less of the acid component. Modification with more than 50 mol % of the acid component is likely to negatively affect the solubility in alkaline developers and photosensitivity.

$R^{12}$ in formula (3) represents a structural constituent of a diamine. Preferably, $R^{12}$ has an aromatic group and a hydroxy group and/or a carboxyl group, from the viewpoint of the heat resistance of the resulting polymer. Exemplary $R^{12}$ may be fluorine-containing bis(aminohydroxyphenyl) hexafluoropropane; a fluorine-free compound, such as diaminodihydroxypyrimidine, diaminodihydroxypyridine, hydroxy-diamino-pyrimidine, diaminophenol, dihydroxy

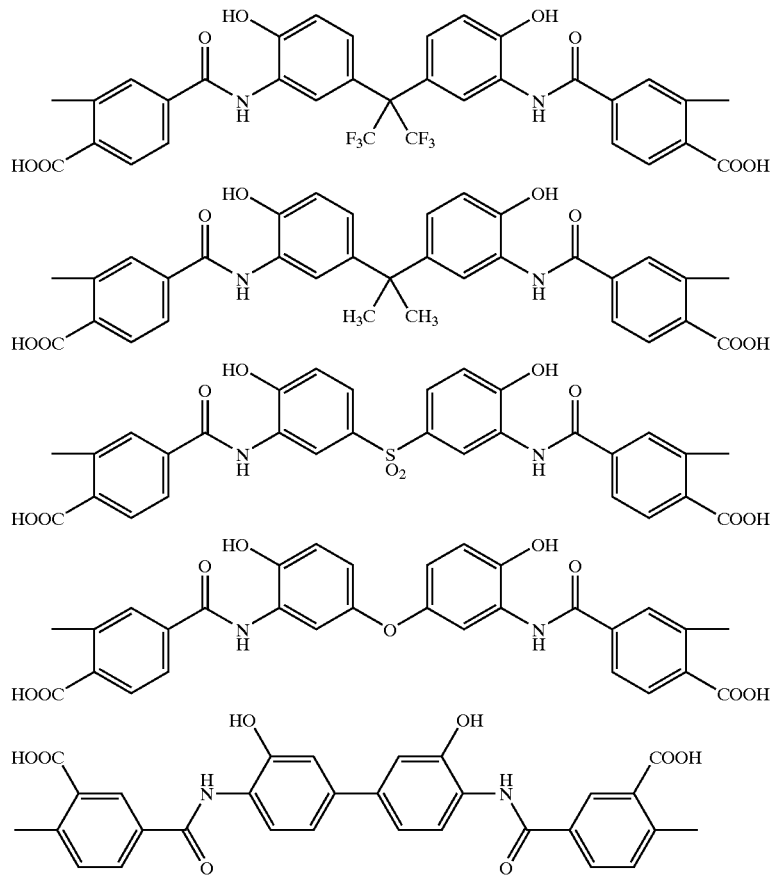

benzidine, or diaminobenzoic acid; or a structure expressed by general formula (6), (7), or (8).

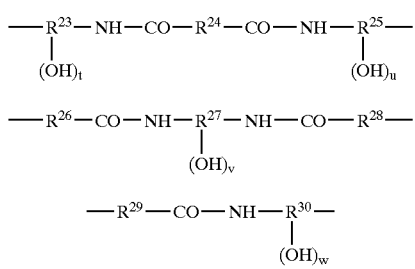

In these formulas, $R^{23}$ and $R^{25}$ of formula (6), $R^{27}$ of formula (7), and $R^{30}$ of formula (8) are, preferably, each an organic group having an aromatic group and a hydroxy group, from the viewpoint of the heat resistance of the resulting polymer. $R^{24}$ of formula (6), $R^{26}$ and $R^{28}$ of formula (7), and $R^{29}$ of formula (8) are, preferably, each an organic group having an aromatic ring, from the viewpoint of the heat resistance of the resulting polymer. Variables t and u in formula (6) each represent an integer of 1 or 2, and variable v in formula (7) and w in formula (8) each represent an integer in the range of 1 to 4.

The $R^{12}(COOR^{14})_f(OH)_q$ structure in formula (3) may be expressed by formula (6), and exemplary compounds expressed by formula (6) are as follows:

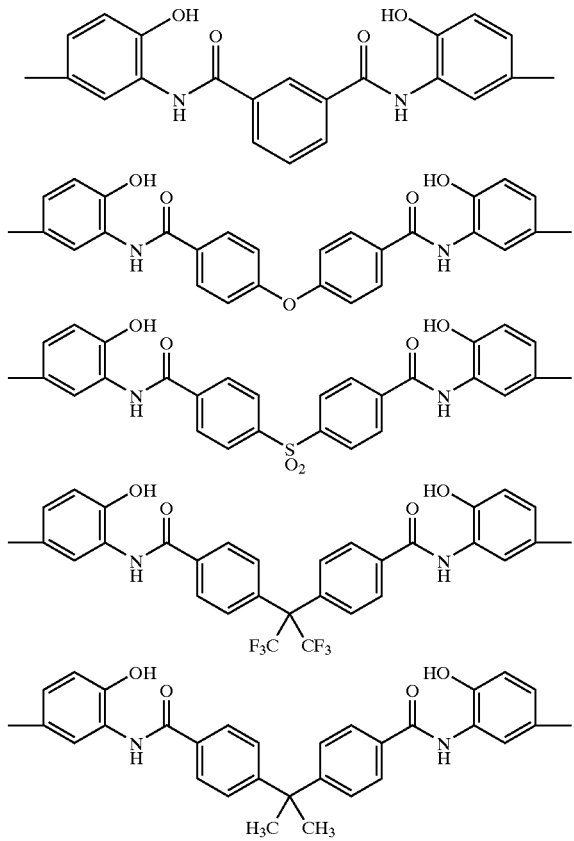

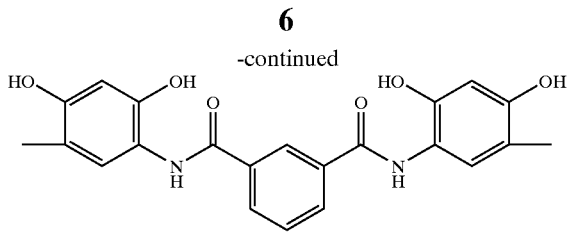

The $R^{12}(COOR^{14})_f(OH)_q$ structure in formula (3) may be expressed by formula (7), and exemplary compounds expressed by formula (7) are as follows:

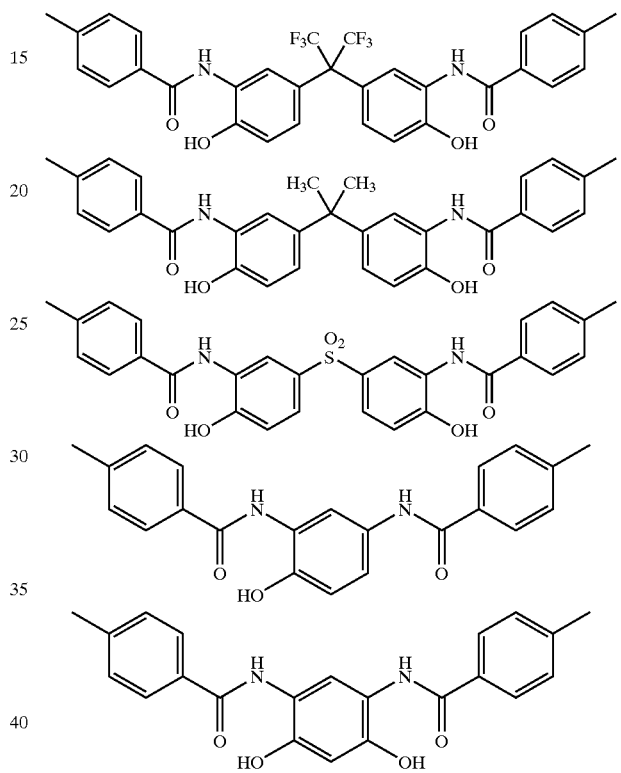

The $R^{12}(COOR^{14})_f(OH)_q$ structure in formula (3) may be expressed by formula (8), and exemplary compounds expressed by formula (8) are as follows:

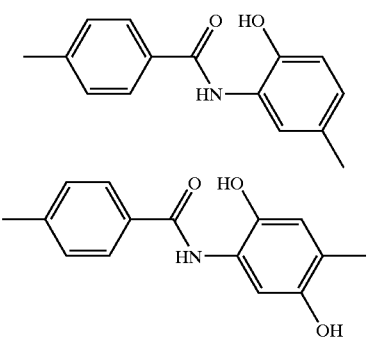

$R^{23}$ and $R^{25}$ of formula (6) represent organic groups with a carbon number in the range of 2 to 20, each having a valence of 3 or 4 and a hydroxy group, and preferably have an aromatic group from the viewpoint of the heat resistance of the resulting polymer. Specifically, exemplary groups represented by $R^{23}$ and $R^{25}$ include hydroxyphenyl, dihydroxyphenyl, hydroxynaphthyl, dihydroxynaphthyl, hydroxybiphenyl, dihydroxybiphenyl, bis(hydroxyphenyl) hexafluoropropane, bis(hydroxyphenyl)propane, bis (hydroxyphenyl)sulfone, hydroxydiphenyl ether, and dihydroxydiphenyl ether. Also, aliphatic groups, such as hydroxycyclohexyl and dihydroxycyclohexyl, may be used. $R^{24}$ represents a divalent organic group having a carbon number in the range of 2 to 30. Preferably, it is a divalent group having an aromatic group from the viewpoint of the heat resistance of the resulting polymer, and may be phenyl, biphenyl, diphenyl ether, diphenylhexafluoropropane, diphenylpropane, or diphenylsulfone. In addition, aliphatic groups such as cyclohexyl may be used.

$R^{26}$ and $R^{28}$ of formula (7) represent divalent organic groups having a carbon number in the range of 2 to 20. Preferably, they have an aromatic group from the viewpoint of the heat resistance of the resulting polymer, and may be phenyl, biphenyl, diphenyl ether, diphenylhexafluoropropane, diphenylpropane, or diphenylsulfone. In addition, aliphatic groups such as cyclohexyl may be used. $R^{27}$ represents an organic group with a carbon number in the range of 3 to 20, each having a valence in the range of 3 to 6, and, preferably, has an aromatic group from the viewpoint of the heat resistance of the resulting polymer. Specifically, exemplary groups represented by $R^{27}$ include hydroxyphenyl, dihydroxyphenyl, hydroxynaphthyl, dihydroxynaphthyl, hydroxybiphenyl, dihydroxybiphenyl, bis(hydroxyphenyl)hexafluoropropane, bis(hydroxyphenyl) propane, bis(hydroxyphenyl)sulfone, hydroxydiphenyl ether, and dihydroxydiphenyl ether. In addition, aliphatic groups, such as hydroxycyclohexyl and dihydroxycyclohexyl, may be used.

$R^{29}$ of formula (8) represents a divalent organic group having a carbon number in the range of 2 to 20. Preferably, it has an aromatic group from the viewpoint of the heat resistance of the resulting polymer, and may be phenyl, biphenyl, diphenyl ether, diphenylhexafluoropropane, diphenylpropane, or diphenylsulfone. In addition, aliphatic groups such as cyclohexyl may be used. $R^{30}$ represents an organic group with a carbon number in the range of 3 to 20, each having a valence in the range of 3 to 6, and, preferably, has an aromatic group from the viewpoint of the heat resistance of the resulting polymer. Specifically, exemplary groups represented by $R^{30}$ include hydroxyphenyl, dihydroxyphenyl, hydroxynaphthyl, dihydroxynaphthyl, hydroxybiphenyl, dihydroxybiphenyl, bis(hydroxyphenyl) hexafluoropropane, bis(hydroxyphenyl)propane, bis (hydroxyphenyl)sulfone, hydroxydiphenyl ether, and dihydroxydiphenyl ether. In addition, aliphatic groups, such as hydroxycyclohexyl and dihydroxycyclohexyl, may be used.

The foregoing diamines may be modified with 1 to 40 mol % of another diamine component. Such diamine components include phenylenediamine, diaminodiphenyl ether, aminophenoxybenzene, diaminodiphenylmethane, diaminodiphenylsulfone, bis(trifluoromethyl)benzidine, bis (aminophenoxyphenyl)propane, and bis (aminophenoxyphenyl)sulfone. Aromatic rings of these compounds may have a substituted alkyl group or halogen. In addition, aliphatic diamines such as cyclohexyldiamine and methylenebis(cyclohexylamine) may be used. Copolymerization with more than 40 mol % of these diamine components negatively affects the heat resistance of the resulting polymer.

$R^{13}$ and $R^{14}$ of formula (3) each represent hydrogen or an organic group having a carbon number in the range of 1 to 20. It is preferable that $R^{13}$ and $R^{14}$ be organic groups from the viewpoint of the stability of the resulting positive photosensitive resin precursor solution and the solubility of the polymer in a solvent of the present invention. However, from the viewpoint of the solubility in alkaline developers, it is preferable that $R^{13}$ and $R^{14}$ be hydrogen. In the present invention, hydrogen and an alkyl group may be present together. Since the dissolution speed in an alkaline developer changes according to the proportion between hydrogen and the organic group in $R^{13}$ and $R^{14}$, an appropriate selection of the proportion between hydrogen and the organic group can achieve a positive photosensitive resin precursor composition exhibiting a suitable dissolution speed. Preferably, the proportion of hydrogen in $R^{13}$ and $R^{14}$ is in the range of 10 to 90 percent. More preferably, it is in the range of 10 to 50 percent. A hydrogen proportion of more than 50 percent is likely to cause the solubility of the polymer in the solvent of the present invention to decrease. A hydrogen proportion of more than 90 percent is likely to cause the polymer to precipitate during spin coating, consequently, negatively affecting film thickness uniformity. A hydrogen proportion of less than 10 percent causes the dissolution speed of the polymer in alkaline developers to decrease and is, consequently, likely to negatively affect sensitivity. Carbon numbers of $R^{13}$ and $R^{14}$ larger than 20 result in polymers insoluble in alkaline developers. Accordingly, it is preferable that $R^{13}$ and $R^{14}$ contain at least one hydrocarbon group having a carbon number in the range of 1 to 16, and hydrogen's at the other positions.

Variables m and f in formula (3) represent integers in the range of 0 to 2. When variables m, f, and p are 0, formula (3) represents polyhydroxyamide, which is a polybenzoxazol precursor. In this instance, preferably, $R^{11}$ is a group having an aromatic group and a valence of 3 or 4, from the viewpoint of the heat resistance of the resulting polymer. Specifically, exemplary groups represented by $R^{11}$ include hydroxyphenyl, dihydroxyphenyl, hydroxynaphthyl, dihydroxynaphthyl, hydroxybiphenyl, dihydroxybiphenyl, bis(hydroxyphenyl)hexafluoropropane, bis(hydroxyphenyl) propane, bis(hydroxyphenyl)sulfone, hydroxydiphenyl ether, and dihydroxydiphenyl ether. In addition, aliphatic groups, such as hydroxycyclohexyl and dihydroxycyclohexyl, may be used. $R^{12}$ is, preferably, a divalent group having an aromatic group from the viewpoint of the heat resistance of the resulting polymer, and may be phenyl, biphenyl, diphenyl ether, diphenylhexafluoropropane, diphenylpropane, or diphenylsulfone. In addition, aliphatic groups such as cyclohexyl may be used.

When variables m and f in formula (3) are each 1 or 2, formula (3) represents a polyamic acid including a structural unit having a carboxyl group of diamine. In this instance, $R^{11}$ is preferably an aromatic tetracarboxylic dianhydride, such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 3,3',4,4'-biphenylethertetracarboxylic dianhydride, 3,3',4,4'-diphenylsulfonetetracarboxylic dianhydride, 1,2,3,4-cyclopentanetetracarboxylic dianhydride, 1,2,5,6-naphthalenetetracarboxylic dianhydride, 2,3,6,7-naphthalenetetracarboxylic dianhydride, 1,4,5,8-naphthalenetetracarboxylic dianhydride, 2,3,5,6-pyridinetetracarboxylic dianhydride, 3,4,9,10-perylenetetracarboxylic dianhydride, 3,3',4,4'-diphenylsulfonetetracarboxylic dianhydride, 3,3',4,4'-tetraphenylsilanetetracarboxylic dianhydride, or 2,2-bis(3,4-dicarboxyphenyl)hexafluoropropane dianhydride. $R^{12}$ is preferably a group with a valence in the range of 3 to 8 having an aromatic group from the viewpoint of the heat resistance of the resulting polymer. Preferred $R^{12}$ may be aromatic diamine compounds, such as 2,5-diaminobenzoic acid, 3,4-diaminobenzoic acid, 3,5-diaminobenzoic acid, 2,5-diaminoterephthalic acid, bis(4-amino-3-carboxyphenyl)methylene, bis(4-amino-3-carboxyphenyl) ether, 4,4'-diamino-3,3'-dicarboxybiphenyl, and 4,4'-diamino-5,5'-dicarboxy-2,2'-dimethylbiphenyl.

n in formula (3) represents the number of the structural unit repetition of the polymer and is, preferably in the range of 10 to 100000. An excessively small n is liable to negatively affect the pattern shape, ease of development, and heat resistance. In contrast, an excessively large n is liable to negatively affect the ease of development, sensitivity, and resolution. In the present invention, n is determined by dividing the weight-average molecular weight, in terms of polystyrene, of the heat resistant resin precursor polymer, obtained by gel permeation chromatography, by the molecular weight per structural unit of the heat resistant resin precursor polymer. Preferably, the weigh-average molecular weight of the heat resistant resin precursor polymer obtained by gel permeation chromatography is in the range of 3000 to 100000, and more preferably in the range of 5000 to 50000.

In addition, in order to increase adhesion properties of the resulting film with a substrate, $R^{11}$ and $R^{12}$ may be copolymerized with an aliphatic group having a siloxane structure, unless the heat resistance is negatively affected. Specifically, $R^{11}$ and $R^{12}$ may be copolymerized with 1 to 10 mol % of bis(3-aminopropyl)tetramethyldisiloxane, bis(p-aminophenyl)octamethylpentasiloxane, or other diamine components.

Formula (4) expresses a polyamic acid or a polyamic ester having a carbon-carbon unsaturated double bond, which advantageously facilitate giving a negative form to the polymer. Formula (4) may contain 10 percent by weight or more of fluorine. A fluorine content of more than 20 percent by weight disadvantageously causes the resistance to organic solvents of the polymer formed to a ring structure by heat treatment to deteriorate, and leads to a reduced solubility in fuming nitric acid. Accordingly, the fluorine content is preferably set in the range of 10 to 20 percent by weight.

In formula (4), $R^{15}$ represents a structural constituent of an acid dianhydride, and is preferably an organic group with a valence in the range of 2 to 8 having a carbon number of at least 2, containing an aromatic group. More preferably, the carbon number is in the range of 6 to 30 and the valence is 3 or 4. Exemplary organic groups represented by $R^{15}$ include 3,3',4,4'-biphenyltetracarboxylic dianhydride, 3,3',4,4'-diphenylethertetracarboxylic dianhydride, 3,3',4,4'-diphenylhexafluoropropanetetracarboxylic dianhydride, 3,3',4,4'-benzophenonetetracarboxylic dianhydride, 3,3',4,4'-diphenylsulfonetetracarboxylic dianhydride, pyromellitic anhydride, butanetetracarboxylic dianhydride, and cyclopentanetetracarboxylic dianhydride, but not limited to these.

These compounds may be modified with: aromatic tetracarboxylic acids, such as pyromellitic acid, benzophenonetetracarboxylic acid, biphenyltetracarboxylic acid, diphenylethertetracarboxylic acid, and diphenylsulfonetetracarboxylic acid, and diester compounds in which two carboxyl groups of these aromatic carboxylic acids are formed to a methyl or ethyl group; aliphatic tetracarboxylic acids, such as butanetetracarboxylic acid and cyclopentanetetracarboxylic acid, and diester compounds in which two carboxyl groups of these aliphatic carboxylic acids are formed to a methyl or ethyl group; aromatic dicarboxylic acids, such as terephthalic acid, isophthalic acid, diphenyletherdicarboxylic acid, and naphthalenedicarboxylic acid; and aliphatic dicarboxylic acids, such as adipic acid. Preferably, the acid component of $R^{15}$ is modified at a ratio of 50 mol % or less, and more preferably at a ratio of 30 mol % or less. Modification at a ratio of more than 50 mol % may negatively affect photosensitivity.

$R^{16}$ in formula (4) represents a structural constituent of a diamine. Preferably, $R^{16}$ has an aromatic group from the viewpoint of the heat resistance of the resulting polymer. Specifically, $R^{16}$ may be para-phenylenediamine, meta-phenylenediamine, methyl-para-phenylenediamine, methyl-meta-phenylenediamine, dimethyl-para-phenylenediamine, dimethyl-meta-phenylenediamine, trimethyl-para-phenylenediamine, trimethyl-meta-phenylenediamine, tetramethyl-para-phenylenediamine, tetramethyl-meta-phenylenediamine, trifluoromethyl-para-phenylenediamine, trifluoromethyl-meta-phenylenediamine, bis(trifluoro)methyl-para-phenylenediamine, bis(trifluoro)methyl-meta-phenylenediamine, methoxy-para-phenylenediamine, methoxy-meta-phenylenediamine, trifluoromethoxy-para-phenylenediamine, trifluoromethoxy-meta-phenylenediamine, fluoro-para-phenylenediamine, fluoro-meta-phenylenediamine, chloro-para-phenylenediamine, chloro-meta-phenylenediamine, bromo-para-phenylenediamine, bromo-meta-phenylenediamine, carboxy-para-phenylenediamine, carboxy-meta-phenylenediamine, methoxycarbonyl-para-phenylenediamine, methoxycarbonyl-meta-phenylenediamine, diaminodiphenylmethane, bis(aminomethylphenyl)methane, bis(aminotrifluoromethylphenyl)methane, bis(aminoethylphenyl)methane, bis(aminochlorophenyl)methane, bis(aminodimethylphenyl)methane, bis(aminodiethylphenyl)methane, diaminodiphenylpropane, bis(aminomethylphenyl)propane, bis(aminotrifluoromethylphenyl)propane, bis(aminoethylphenyl)propane, bis(aminochlorophenyl)propane, bis(aminodimethylphenyl)propane, bis(aminodiethylphenyl)propane, diaminodiphenylhexafluoropropane, bis(aminomethylphenyl)hexafluoropropane, bis(aminotrifluoromethylphenyl)hexafluoropropane, bis(aminoethylphenyl)hexafluoropropane, bis(aminochlorophenyl)hexafluoropropane, bis(aminodimethylphenyl)hexafluoropropane, bis(aminodiethylphenyl)hexafluoropropane, diaminodiphenylsulfone, bis(aminomethy)sulfone, bis(aminoethyl)sulfone, bis(aminotrifluoromethylphenyl)sulfone, bis(aminodimethylphenyl)sulfone, bis(aminodiethylphenyl)sulfone, diaminodiphenyl ether, bis(aminomethylphenyl)ether, bis(aminotrifluoromethylphenyl)ether, bis(aminoethylphenyl)ether, bis(aminodimethylphenyl)ether, bis(aminodiethylphenyl)ether, dimethylbenzidine, bis(trifluoromethyl)benzidine, dichlorobenzidine, bis(aminophenoxy)benzene, bis(aminophenoxyphenyl)propane, bis(aminophenoxyphenyl)hexafluoropropane, bis(aminophenoxyphenyl)ether, bis(aminophenoxyphenyl)methane, bis(aminophenoxyphenyl)sulfone compound, or their hydrogenated compounds, but $R^{16}$ is not limited to these. These compounds may be present singly or in combination.

Also, these compounds may be modified with 1 to 40 mol % of another diamine component. Such components include phenylenediamine, diaminodiphenyl ether, aminophenoxybenzene, diaminodiphenylmethane, diaminodiphenylsulfone, bis(trifluoro)methylbenzidine, bis (aminophenoxyphenyl)propane, and bis (aminophenoxyphenyl)sulfone. Aromatic rings of these compounds may have a substituted alkyl group or halogen. In addition, aliphatic diamines such as cyclohexyldiamine and methylenebis(cyclohexylamine) may be used. Copolymerization with 40 mol % or more of these diamine components negatively affects the heat resistance of the resulting polymer.

$R^{17}$ of formula (4) represents an organic group having a carbon-carbon unsaturated double bond. Exemplary group having a carbon-carbon unsaturated double bond is 2-hydroxyethyl methacrylate, but not limited to this. A monomer may be added to increase the photosensitivity. Exemplary monomers include dimethylaminoethyl acrylate, diethylaminoethyl acrylate, dimethylaminoethyl methacrylate, diethylaminoethyl methacrylate, dimethylaminopropyl methacrylate, dimethylaminobutyl methacrylate, dimethylaminohexyl methacrylate, N-(2-dimethylaminoethyl)methacrylamide, N-(3-dimethylaminopropyl)methacrylaminde, N-(2-diethylaminoethyl)methacrylamide, N-(3-diethylaminopropyl)acrylamide, N-(2-dimethylaminoethyl)acrylamide, N-(3-dimethylaminopropyl)acrylamide, N-(2-diethylaminoethyl)acrylamide, N-(3-diethylaminopropyl) acrylamide, acryloyl morpholine, methacryloyl morpholine, acryloyl piperidine, methacryloyl piperidine, allylamine, diallylamine, triallylamine, methallylamine, vinylpyridine, ammonium ethyltrimethylmethacrylate, ammonium 2-hydroxypropyltrimethylmethacrylate, para (or meta)-dimethylaminoethyl azidobenzoate, para (or meta)-diethylaminoethyl azidobenzoate, para (or meta)-dimethylaminopropyl azidobenzoate, para (or meta)-diethylaminopropyl azidobenzoate, para (or meta)-dimethylaminoethyl azidosulfonylbenzoate, para (or meta)-diethylaminoethyl azidosulfonylbenzoate, para (or meta)-dimethylaminopropyl azidosulfonylbenzoate, para (or meta)-diethylaminopropyl azidosulfonylbenzoate, 2-hydroxyethyl methacrylate, trimethylolpropane trimethacrylate, trimethylolpropane triacrylate, ethylene glycol dimethacrylate, diethylene glycol dimethacrylate, triethylene glycol dimethacrylate, tetraethylene glycol dimethacrylate, propylene glycol dimethacrylate, methylene bis(methacrylamide), and methylene bis(acrylamide), but are not limited to these. These compounds may be used singly or in combination.

h in formula (4) represents the number of the structural unit repetition of the polymer and is, preferably, in the range of 10 to 100000.

Preferably, a photoinitiator or a photosensitizer may be added to the polyamic acid derivative to further increase the sensitivity and resolution of a developed pattern. The photoinitiator and the photosensitizer may be used separately or simultaneously.

Photoinitiators suitably added include: aromatic amines, such as N-phenyldiethanolamine, N-phenylglycine, and Michler's ketone; cyclic oxime compounds as epitomized by 3-phenyl-5-isooxazolone; chain oxime compounds as epitomized by 1-phenylpropanedione-2-(o-ethoxycarbonyl) oxime; benzophenone derivatives, such as benzophenone, o-benzoyl methyl benzoate, dibenzyl ketone, and fluorenone; and thioxanthone derivatives, such as thioxanthone, 2-methylthioxanthone, and 2-isopropylthioxanthone, but are not limited to these.

Photosensitizers suitably added include: common photocurable resins including aromatic monoazide, such as azidoanthraquinone and azidobenzalacetophenone; coumarin compounds, such as 3,3'-carbonyl bis (diethylaminocumarin); aromatic ketones, such as benzanthrone and phenanthrenequinone; and charge transfer agents for electrophotography.

Preferably, the photoinitiator and the photosensitizer are added in an amount of 0.01 to 30 percent by weight, preferable 0.1 to 20 percent by weight, relative to the polymer. An amount outside this range leads to a degraded photosensitivity or negatively affects the mechanical strength of the polymer. These photoinitiators and photosensitizers are used singly or in combination.

The heat resistant resin precursor polymer of the present invention may be composed of only the structural unit expressed by formula (3) or (4), or it may be a copolymer or a mixture with other structural units. In this instance, preferably, the heat resistant resin precursor polymer contains 50 mol % or more of the structural unit expressed by formula (3) or (4). More preferably, it contains 70 mol % or more, still more preferably 90 mol % or more, of the structural unit of formula (3) or (4). Preferably, the type and quantity of other structural units used for copolymerization or mixing are selected so as not to negatively affect the heat resistance of the resulting polyimide polymer obtained by final heat treatment.

In the present invention, the end of the polymer of formula (3) or (4) may be allowed to react with an end cap compound. Exemplary end cap compounds include monoamines, acid anhydrides, monocarboxylic acids, monoacid chlorides, and activated monoesters. The reaction with an end cap compound advantageously control the number of repetition of the structural unit of the heat resistant resin precursor polymer. Also, by allowing the heat resistant resin precursor polymer to react with an end cap compound, various types of organic group can be introduced as an end group. Preferably, a polymer prepared by introducing an end cap compound to the polymer to formula (3) has one structure selected from among the structures expressed by general formulas (9) to (12). Preferably, a polymer prepared by introducing an end cap compound to the polymer of formula (4) has one structure selected from among the structures expressed by general formulas (13) to (16).

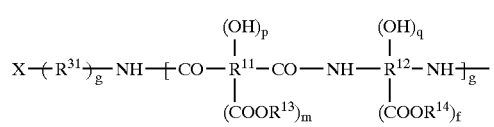

(9)

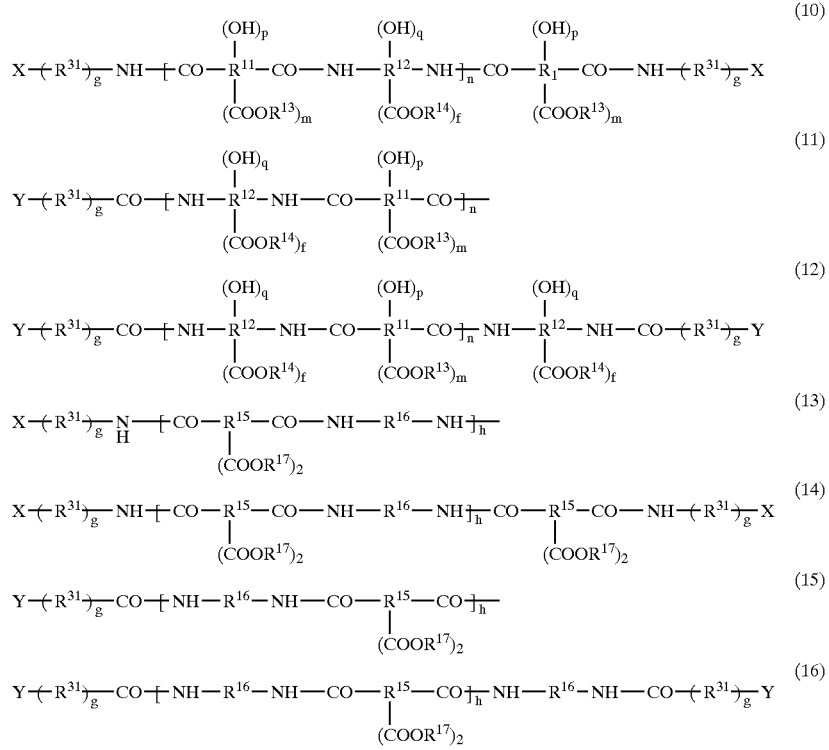

R³¹ in formulas (9) to (16) represents a divalent group selected from among —CR³²R³³—, —CH₂O—, and CH₂SO₂—. R³² and R³³ each represent a monovalent group selected from among hydrogen and hydrocarbons having carbon numbers in the range of 1 to 10. Preferably, R³² and R³³ are each hydrogen or a hydrocarbon having a carbon number in the range of 1 to 4, and more preferably hydrogen, the methyl group, or the t-butyl group. Variable g represents an integer in the range of 0 to 10, and preferably in the range of 0 to 4.

X and Y represent organic groups and they contribute to the increase of the solubility in the organic solvents expressed by formula (1) and (2) described later.

In formulas (9), (10), (13), and (14), —NH—(R³¹)$_g$—X is derived from a primary monoamine being an end cap compound. In formulas (11), (12), (15), and (16), —CO—(R³¹)$_g$—Y is derived from an acid anhydride, a monocarboxylic acid, a monoacid chloride, or activated monoester being an end cap compound.

Monoamines used as end cap compounds include 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, 3-amino-o-toluic acid, Ammelide, 2-aminobenzoic acid, 3-aminobenzoic acid, 4-aminobenzoic acid, 2-aminobenzenesulfonic acid 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-ammino-2-mercaptonaphthalen, 3-amino-4,6-dimercaptopyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene, and 4,8-diethynyl-2-aminonaphthalene, but are not limited to these.

Among these, preferred monoamines are 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, 3-ethynylaniline, 4-ethynylaniline, 3,4-diethynylaniline, and 3,5-diethynylaniline.

Acid anhydrides used as end cap compounds include phthalic anhydride, maleic anhydride, nadic acid, cyclohexanedicarboxylic anhydride, and 3-hydroxyphthalic anhydride. Monocarboxylic acids used as end cap compounds include 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid, and 8-ethynyl-2-naphthoic acid. Monoacid chlorides used as the end cap compounds are formed by acid-chlorination of the carboxyl groups of these carboxylic acids or of only the monocarboxyl groups of dicarboxylic acids, such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, and 2,7-dicarboxynaphthalene. Activated monoesters used as end cap compounds are obtained by a reaction of a monoacid chloride with N-hydroxybenzotriazole or N-hydroxy-5-norbornene-2,3-dicarboxyimide.

Among these, preferred end cap compounds are: anhydrides, such as phthalic anhydride, maleic anhydride, nadic acid, cyclohexanedicarboxylic anhydride, and 3-hydroxyphthalic anhydride; monocarboxylic acids, such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, 4-carboxybenzenesulfonic acid, 3-ethynylbenzoic acid, 4-ethynylbenzoic acid, 3,4-diethynylbenzoic acid, and 3,5-diethynylbenzoic acid; monoacid chlorides formed by acid-chlorination of the carboxyl groups of these carboxylic acids or of only the monocarboxyl groups of dicarboxylic acids, such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene; and activated monoesters obtained by reactions of monoacid chlorides with N-hydroxybenzotriazole or N-hydroxy-5-norbornene-2,3-dicarboxyimide.

The end cap monoamine content is preferably in the range of 0.1 to 60 mol % relative to all the amine components, and more preferably in the range of 5 to 50 mol %. The end cap acid anhydride, monocarboxylic acid, monochloride, or activated monoester content is preferably in the range of 0.1 to 100 mol % relative to diamine components, and more preferably in the range of 5 to 90 mol %. A plurality of types of end cap compound may be allowed to react to introduce a plurality of types of end group.

The end cap compound introduced to the polymer is easily detected by the following method. For example, a polymer to which an end cap compound is introduced is dissolved in an acid solution to decompose the structural unit of the polymer into an amine component and an anhydride component, and is subjected to gas chromatography (GC) or NMR. Alternatively, the polymer to which the end cap compound is introduced is directly subjected to pyrolysis gas chromatography (PGC) or measurement of infrared spectrum and $C^{13}$ NMR spectrum.

The heat resistant resin precursor of the present invention is synthesized by a known method. When the heat resistant resin precursor is a polyamic acid or a polyamic ester, a tetracarboxylic dianhydride may be subjected to a reaction with a diamine compound at low temperature. A diester may be produced from a tetracarboxylic dianhydride and an alcohol and subsequently subjected to a reaction with an amine in the presence of a condensing agent. Also, a diester may be produced from a tetracarboxylic dianhydride and an alcohol, and the rest of the dicarboxylic acid may be subjected to acid chlorination and subsequently to a reaction with an amine.

When the heat resistant resin precursor is a polyhydroxyamide, it is produced by a condensation reaction of a bis(aminophenol) compound and dicarboxylic acid. Specifically, an acid may subjected to a reaction with a dehydration condensing agent, such as dicyclohexylcarbodiimide (DCC), followed by adding a bis(aminophenol) compound, or a dicarbonyl dichloride may be added to a bis(aminophenol) solution containing a tertiary amine, such as pyridine.

The photosensitive resin precursor composition of the present invention contains a radiation sensitive compound. The radiation sensitive compound responses ultraviolet rays, far ultraviolet rays, or radiation such as X rays to produce an acid. Exemplary radiation sensitive compounds include onium compounds such as diaryl iodonium salts, triaryl sulfonium salts, and phenyldiazonium salts, quinone diazide compounds, imidosulfonate derivatives, tosylate compounds, carbonate compounds of benzyl derivatives, and halides of triazine derivatives. In particular, quinone diazide compounds sensitive to i (365 nm), h (405 nm), and g (436 nm) rays from mercury vapor lamps, which are general ultraviolet rays, are preferable.

In particular, a naphthoquinone diazide compound is preferable whose sulfonic acid is bonded with a compound having a phenolic hydroxy group in an ester form. Exemplary compounds having a phenolic hydroxy group include: Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (trade names, produced by Honshu Chemical Industry Co., Ltd.); BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, and TM-BIP-A (trade names, produced by Asahi Organic Chemicals Industry Co., Ltd.); 2,6-dimethoxymethyl-4-t-butylphenol; 2,6-dimethoxymethyl-p-cresol; 2,6-diacetoxymethyl-p-cresol; naphthol; tetrahydroxybenzophenone; methylgallate; bisphenol A; bisphenol E; methylene bisphenol; and BisP-AP (trade name, produced by Honshu Chemical Industry Co., Ltd.). To these compounds, 4-naphthoquinonediazidosulfonic acid or 5-naphthoquinonediazidosulfonic acid is introduced with an ester bond. Also, other compounds having a phenolic hydroxy group may be used.

The 4-naphthoquinonediazidosulfonyl ester has an absorption band in the wavelength band of i rays of a mercury vapor lamp and is suitable for i-ray exposure. The 5-naphthoquinonediazidosulfonyl ester has an absorption bond extending to the wavelength band of g rays and is suitable for g-ray exposure. In the present invention, either of these two compounds may preferably be used, and is selected according to the wavelength of exposure. Also, a naphthoquinonediazidosulfonyl compound having both 4-naphthoquinonediazidosulfonyl group and 5-naphthoquinonediazidosulfonyl group in the molecule thereof may be used. A mixture of a 4-naphthoquinonediazidosulfonyl ester and a 5-naphthoquinonediazidosulfonyl ester may also be used.

The naphthoquinone diazide compound used in the present invention may be synthesized by a known method in which a quinonediazidosulfonic compound is esterified with a compound having a phenolic hydroxy group.

By using the naphthoquinone diazide compound, resolution, sensitivity, and normalized remaining film thickness are increased. Since a naphthoquinone diazide compound having a molecular weight of more than 1500 is not sufficiently decomposed by following heat treatment, such molecular weights may negatively affect the heat resistance, mechanical strength, and adhesion properties of the resulting film. Accordingly, a preferred molecular weight of the naphthoquinone diazide compound is in the range of 300 to 1500. More preferably, it is in the range of 350 to 1200. The naphthoquinone diazide compound content is preferably in the range of 1 to 50 parts by weight relative to 100 parts by weight of the polymer, and more preferably in the range of 3 to 40 parts by weight.

By adding the naphthoquinone diazide compound, film loss after development due to unexposed regions is significantly reduced and, consequently, an excellent pattern can be formed in a short development time.

The photosensitive resin precursor composition also contains a solvent having a hydroxyketone structure expressed by formula (1) or (2).

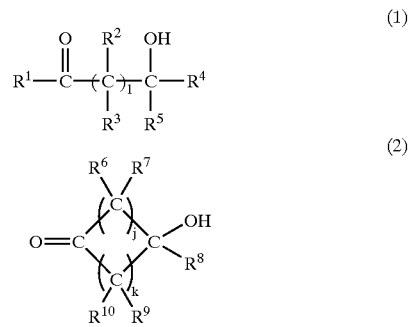

By using these solvents, excellent film thickness uniformity can be achieved. Formula (1) expresses a straight chain structure, and formula (2) expresses a ring structure. In formula (1), $R^1$ represents an alkyl group having a carbon number in the range of 1 to 3, and $R^2$ to $R^5$ each represent hydrogen or an alkyl group having a carbon number in the range of 1 to 3. A carbon number of 4 or more leads to a degraded dissolving ability for the polymer. Variable 1 in formula (1) represents an integer in the range of 0 to 3. Variable 1 of 4 or more leads to a degraded dissolving ability for the polymer. Preferred solvents expressed by formula (1) include acetol, 3-hydroxy-3-methyl-2-butanone, 4-hydroxy-3-methyl-2-butanone, 5-hydroxy-2-pentanone, and 4-hydroxy-4-methyl-2-pentanone (diacetone alcohol). Diacetone alcohol is particularly preferable from the viewpoint of dissolving ability and volatility.

$R^6$ to $R^{10}$ of formula (2) each represent hydrogen or an alkyl group having a carbon number in the range of 1 to 3. A carbon number of 4 or more leads to a degraded dissolving ability for the polymer. Variables j and k in formula (2) represent integers in the range of 0 to 3. Variables j and k of 4 or more lead to a degraded dissolving ability for the polymer. To ensure a stable ring structure, the expression $j+k \geq 2$ is satisfied. Preferred solvents expressed by formula (2) include 2-hydroxycyclobutanone, 3-hydroxycyclobutanone, 2-hydroxycyclopentanone, 3-hydroxycyclopentanone, 2-hydroxycyclohexanone, 3-hydroxycyclohexanone, 4-hydroxycyclohexanone, 2-hydroxycycloheptanone, 3-hydroxycycloheptanone, 4-hydroxycycloheptanone, 2-hydroxycyclooctanone, 3-hydroxycyclooctanone, 4-hydroxycyclooctanone, and 5-hydroxycyclooctanone.

The solvent of formula (1) or (2) may be used singly or in combination with other solvents. Since, when a high concentration of resin is used, the solubility in the solvent of the resin is likely to decrease, it is preferable to use solvents in combination. If other solvents are mixed, the content of the solvent of formula (1) or (2) is preferably in the range of 20 to 95 percent by weight to the total amount of solvents. A content of the solvent of (1) or (2) of less than 20 percent by weight does not achieve the expected effect of the solvent of formula (1) or (2) because the film thickness uniformity of the photosensitive resin precursor composition depends on the dissolving ability and volatility of an additional solvent. A content of 95 percent by weight or more of the solvent of formula (1) or (2) may negatively affect the dissolving ability for the resin. Accordingly, a preferred content of the solvent of formula (1) or (2) is in the range of 30 to 90 percent by weight.

The additional solvent used in combination with the solvent of formula (1) or (2) is not particularly limited, as long as it can dissolve the heat resistant resin precursor polymer. Such solvents include: polar solvents, such as N-methyl-2-pyrrolidone, N-cyclohexyl-2-pyrrolidone, N,N-dimethylacetamide, N,N-dimethylformamide, dimethylsulfoxide, γ-butyrolactone, and dimethylacrylamide; esters, such as ethylene glycol monomethyl ether, propylene glycol monomethyl ether, propylene glycol monomethyl ether acetate, ethyl acetate, ethyl lactate, and butyl lactate; and ketones, such as cyclopentanone, cyclohexanone, isobutyl ketone, and methyl isobutyl ketone.

Also, in order to enhance the sensitivity of the photosensitive resin precursor composition, a compound having a phenolic hydroxy group may be added, if necessary.

Such compounds having a phenolic hydroxy group include Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakis P-DO-BPA), TrisP-HAP, TrisP-PA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylene tris-FR-CR, and BisRS-26X, BisRS-OCHP (trade names, produced by Honshu Chemical Industry Co., Ltd.); and BIR-OC, BIP-PC, BIR-PC, BIR-PTBP, BIR-PCHP, BIP-BIOC-F, 4PC, BIR-BIPC-F, and TEP-BIP-A (trade names, produced by Asahi organic Chemicals Industry Co., Ltd.).

Among these, preferred compounds are, for example, Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylene tris-FR-CR, BisRS-26X, BIP-PC, BIR-PC, BIR-PTBP, and BIR-BIPC-F. Particularly preferred compounds are, for example, Bis-Z, TekP-4HBPA, TrisP-HAP, TrisP-PA, BisRS-2P, BisRS-3P, BIR-PC, BIR-PTBP, and BIR-BIPC-F. By adding a compound having a phenolic hydroxy group, the resulting resin composition can easily be dissolved in an alkaline developer by exposure though it is hardly dissolved in the alkaline developer before exposure. Consequently, the thickness of the film does not reduced by development and the development can be completed in a short time.

The content of the compound having a phenolic hydroxy group is preferably in the range of 1 to 50 parts by weight relative to 100 parts by weight of the polymer, and more preferably in the range of 3 to 40 parts by weight.

In addition, in order to enhance the wettability between a substrate and the photosensitive resin precursor composition, a surfactant, an ester such as ethyl lactate or propylene glycol monomethyl ether acetate, an alcohol such as ethanol, an ketone such as cyclohexanone or methyl isobutyl ketone, or an ether such as tetrahydrofuran or dioxane may be added, if necessary. Also, organic particles, such as of silicon dioxide or titanium dioxide, or polyimide powder may be added.

Furthermore, in order to enhance adhesion properties with a base substrate such as a silicon wafer, 0.5 to 10 percent by weight of a silane coupler or a titanium chelating agent may be added to a varnish, that is, the photosensitive, heat resistant resin precursor composition, or the base substrate may be subjected to pretreatment with such a chemical.

In the case of adding a chemical to the varnish, a silane coupler, such as methylmethacryloxydimethoxysilane or 3-aminopropyltrimethoxysilane, a titanium chelate, or an aluminium chelate is added in an amount of 0.5 to 10 percent by weight relative to the polymer in the vanish.

In the case of treating the substrate, a solution of 0.5 to 20 percent by weight of a coupler in a solvent is applied by spin coating, immersion, spray coating, or steaming. In this instance, exemplary solvents include isopropyl alcohol, ethanol, methanol, water, tetrahydrofuran, propylene glycol monomethyl ether acetate, propylene glycol monomethyl ether, ethyl lactate, and diethyl adipate. Then, in some cases, the coupler and the substrate are heated to a temperature of 50 to 300° C. to promote the reaction of the coupler with the substrate.

A method for forming a heat resistant resin pattern using the photosensitive resin precursor composition of the present invention will now be described.

The photosensitive resin precursor composition is applied onto a substrate. A silicon wafer, ceramics, gallium arsenide, glass, ITO, and the like are used as the substrate. The application of the composition may be performed by spin coating, spray coating, or roll coating. The thickness of the coated film depends on the solid content in and the viscosity of the composition, but is generally set in the range of 0.1 to 150 μm.

Next, the substrate coated with the photosensitive resin precursor composition is dried to form a film. The drying is preferably performed at a temperature of 50 to 150° C. for a period of time between 1 minute and several hours with an oven, a heater, or infrared rays.

The photosensitive resin precursor film is exposed to actinic rays through a mask having a desired pattern. Ultraviolet light, visible light, electron rays, and X rays are generally used as the actinic rays, and, in the present invention, i rays (365 nm), h rays (405 nm), or g rays (436 nm) from a mercury vapor lamp is preferably used.

Exposed regions of the film are removed with a developer to form a heat resistant resin pattern. Preferably, the developer is an aqueous solution of an alkaline compound, such as tetramethylammonium, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine. In some cases, polar solvents, alcohols, esters, or ketones may be added to the alkaline aqueous solution singly or in combination. The polar solvents include N-methyl-2-pyrrolidone, N,N-dimethylformamide, N,N-dimethylacetamide, dimethylsulfoxide, γ-butyrolactone, and dimethylacrylamide. The alcohols include methanol, ethanol, and isopropyl alcohol. The esters include ethyl lactate, and propylene glycol monomethyl ether acetate, and the ketones include cyclopentanone, cyclohexanone, isobutyl ketone, and methyl isobutyl ketone. After development, the substrate is rinsed with water. The water may contain alcohol, such as ethanol or isopropyl alcohol, or an ester, such as ethyl lactate or propylene glycol monomethyl ether acetate.

Then, the pattern is heated to temperatures of 200 to 500° C. to be converted to a heat resistant resin coating film.

Temperature is raised by steps or continuously to a predetermined range, and, thus, heat treatment is performed for a period of time between 5 minutes and 5 hours. For example, the pattern is heated to temperatures at 130° C., 200° C., and 350° C. for 30 minutes each. Alternatively, the pattern is continuously heated from room temperature to 400° C., taking 2 hours.

The resulting heat resistant resin coating film is used as a passivation film of semiconductors, a protective film of semiconductor elements, an insulating interlayer of multilayer wires for high density packing, an insulating layer of organic electroluminescent devices, and other films.

EXAMPLES

The present invention will be further described with reference to examples, but it is not limited to these examples. In the examples, the film thickness uniformity of the photosensitive resin precursor composition was evaluated as follows.

Formation of Photosensitive Polyimide Precursor Film

The photosensitive resin precursor composition (hereinafter referred to as a varnish) was applied onto a 6-inch silicon wafer such that the thickness of the film would be 7 $\mu$m after prebaking, and was, then, prebaked at 120° C. for 3 minutes on a hot plate (Mark-7 manufactured by Tokyo Electron Limited) to form a photosensitive polyimide precursor film.

Film Appearance Check

After the formation of the film, it was visually checked whether there is any abnormality, such as striation or repellency. Striation refers to a phenomenon in which radial streaks occur on the wafer due to precipitation of the polymer in the varnish. Repellency refers to a state in which the varnish backs from the end of the wafer such as not to cover the entire surface of the wafer.

Measurement of Thickness

The thickness was measured at a refractive index of 1.629 with RamdaA STM-602 manufactured by Dainippon Screen Mfg. Co., Ltd. The measurement was performed on 15 points of the 6-inch silicon wafer at intervals of 1 cm between −7 cm and +7 cm from the center in a direction parallel to the orientation flat. The average of the thicknesses at 15 points was defines as the thickness ($\mu$m) of the film and the difference between the highest and lowest values was defines as the range ($\mu$m). The uniformity of the thickness was evaluated by the range, and a smaller range means a better uniformity.

Foreign Matter Check

The varnish was applied on a 4-inch silicon wafer by spin coating at 500 rpm for 10 seconds and subsequently at 3000 rpm for 30 seconds, and was prebaked on a hot plate at 90° C. for 2 minutes. The number of foreign matters of 0.27 $\mu$m or more in size was measured with a laser surface testing apparatus LS-5000 manufactured by Hitachi Electronics Engineering Co., Ltd. to obtain the density (pcs/cm$^2$) of the foreign matters.

Measurement of 5% Weight Loss Temperature

The varnish was applied onto a 6-inch silicon wafer such that the thickness of the film would be about 13 $\mu$m after prebaking, and was, then, prebaked at 120° C. for 3 minutes on a hot plate (Mark-7 manufactured by Tokyo Electron Limited) to form a film. The resulting film was heat-treated with an inert gas oven INH-21CD, manufactured by Koyo Thermo Systems Co., Ltd., at 140° C. for 30 minutes, subsequently at increasing temperature to 350° C. for 1 hour, and at 350° C. for 1 hour to cure the film, in a nitrogen gas flow (oxygen content: 10 ppm or less). The cured film of 15 to 20 mg in weight was placed in a platinum cell and allowed to stand in an atmosphere of nitrogen gas at 250° C. for 30 minutes, and was, then, heated up to 800° C. at a rate of 10° C./min. A weight after standing at 250° C. for 30 minutes was defines as the initial weight, and temperature when the weight was reduced by 5% was defied as the 5% weight loss temperature.

Synthesis 1: Acid Anhydride (a) Containing a Hydroxy Group

In a dry nitrogen gas flow, 18.3 g (0.05 mol) of 2,2-bis (3-amino-4-hydroxyphenyl)hexafluoropropane (BAHF) and 34.2 g (0.3 mol) of allyl glycidyl ether were dissolved in 100 g of γ-butyrolactone (GBL) and cooled to −15° C. A solution of 22.1 g (0.11 mol) of trimellitoyl chloride anhydride in 50 g of GBL was dripped into the reaction solution above such as not to increase the temperature of the reaction solution to more than 0° C. After dripping, a reaction was performed at 0° C. for 4 hours. The resulting solution was condensed with a rotary evaporator, and placed in 1L of toluene to yield an acid anhydride (a).

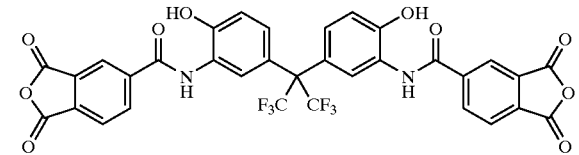

ACID ANHYDRIDE (a)

Synthesis 2: Diamine (b) Containing a Hydroxy Group

BAHF in a weight of 18.3 g (0.05 mol) was dissolved in 100 mL of acetone and 17.4 g (0.3 mol) of propylene oxide and cooled to −15° C. A solution of 20.4 g (0.11 mol) of 4-nitrobenzoyl chloride in 100 mL of acetone was dripped into the reaction solution above. After dripping, the reaction mixture was allowed to react at −15° C. for 4 hours and heated to room temperature. A white solid precipitate was separated out by filtration and vacuum-dried at 50° C.

The solid in a weight of 30 g was placed in a 300 mL stainless autoclave. The solid was dispersed in 250 mL of methyl Cellosolve, and 2 g of 5% palladium-carbon was added. Hydrogen was introduced into the mixture with a balloon to perform a reduction reaction at room temperature. After 2 hours, it was ensured that the balloon did not deflate any more and the reaction was finished. After the reaction, a palladium compound, which had served as a catalyst, was removed by filtration, and the product was condensed with a rotary evaporator to yield a diamine compound (b). The resulting diamine compound was used without being processed.

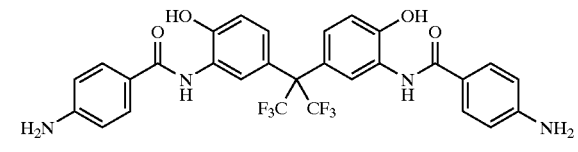

DIAMINE (b)

Synthesis 3: Diamine (c) Containing a Hydroxy Group

In 50 mL of acetone and 30 g (0.34 mol) of propylene oxide was dissolved 15.4 g (0.1 mol) of 2-amino-4-nitrophenol, and the solution was cooled to −15° C. A solution of 11.2 g (0.055 mol) of isophthaloyl chloride in 60 mL of acetone was slowly dripped into the reaction solution.

After dripping, the mixture was allowed to react at −15° C. for 4 hours. Then, the reaction mixture was heated to room temperature to precipitate a product. The product was collected by filtration.

The precipitate was dissolved in 200 mL of GBL, and 3 g of 5% palladium-carbon was added to the solution, followed by stirring hard. Hydrogen gas was introduced to the reaction mixture with a balloon. The mixture was stirred until the balloon became such as not to deflate any more and further stirred for 2 hours with the balloon attached. After stir, a palladium compound was removed by filtration, and the product solution was condensed to half that volume with a rotary evaporator. Ethanol was added to the product to recrystallize, and, thus, crystals of the target compound were obtained.

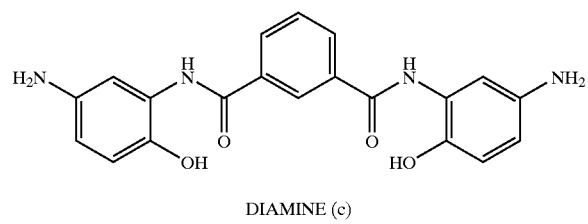

DIAMINE (c)

Synthesis 4: Diamine (d) Containing a Hydroxy Group

In 100 mL of acetone and 17.4 g (0.3 mol) of propylene oxide was dissolved 15.4 g (0.1 mol) of 2-amino-4-nitrophenol, and the solution was cooled to −15° C. A solution of 20.4 g (0.11 mol) of 4-nitrobenzoyl chloride in 100 mL of acetone was slowly dripped into the reaction solution above. After dripping, the mixture was allowed to react at −15° C. for 4 hours. Then, the reaction mixture was heated to room temperature to precipitate a product. The product was collected by filtration. Then, crystals of the target compound were obtained as in Synthesis 2.

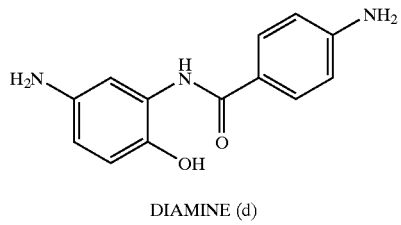

DIAMINE (d)

Synthesis 5: Quinone Diazide (e)

In a dry nitrogen gas flow, 10.7 g (0.05 mol) of bisphenol E and 26.86 g (0.1 mol) of 5-naphthoquinonediazidosulfonyl chloride were dissolved in 450 g of 1,4-dioxane, and the temperature of the solution was allowed to be room temperature. A mixture of 50 g of 1,4-dioxane and 10.12 g of triethylamine was dripped into the reaction solution above such as not to increase the temperature to 35° C. or more. After dripping, the mixture was stirred at 30° C. for 2 hours. A triethylamine salt was removed by filtration and the filtrate was placed in water. Then, a precipitate was collected by filtration. The precipitate was dried in a vacuum dryer to yield a quinone diazide compound (e).

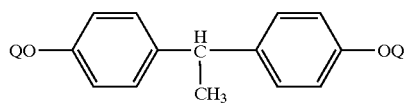

QUINONE DIAZIDE (e)

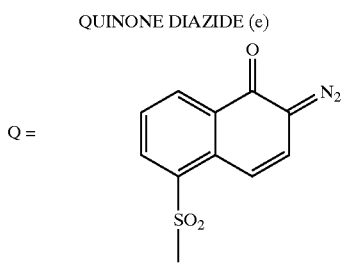

Synthesis 6: Quinone Diazide (f)

In a dry nitrogen gas flow, 14.6 g (0.05 mol) of TrisP-SA (trade name, produced by Honshu chemical Industry Co., Ltd.), 13.43 g (0.05 mol) of 4-naphthoquinonediazidosulfonyl chloride, and 17.46 g (0.065 mol) of 5-naphthoquinonediazidosulfonyl chloride were dissolved in 450 g of 1,4-dioxane, and the temperature of the solution was allowed to be room temperature. A mixture of 50 g of 1,4-dioxane and 11.64 g of triethylamine was dripped into the solution as in Synthesis 5 to yield quinone diazide (f).

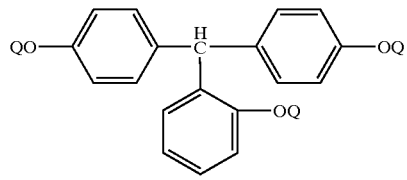

QUINONE DIAZIDE (f)

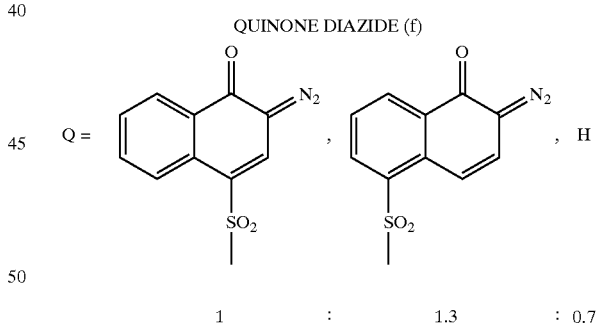

1  :  1.3  :  0.7

Synthesis 7: Quinone Diazide (g)

In a dry nitrogen gas flow, 24.1 g (0.05 mol) of TrisOCR-PA (trade name, produced by Honshu chemical Industry Co., Ltd.), 13.43 g (0.05 mol) of 4-naphthoquinonediazidosulfonyl chloride, and 20.15 g (0.075 mol) of 5-naphthoquinonediazidosulfonyl chloride were dissolved in 450 g of 1,4-dioxane, and the temperature of the solution was allowed to be room temperature. A mixture of 50 g of 1,4-dioxane and 12.65 g of triethylamine was dripped into the solution as in Synthesis 5 to yield quinone diazide (g).

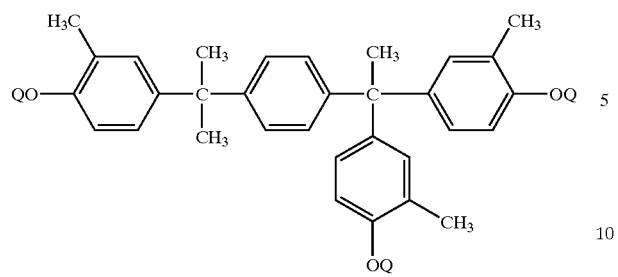

QUINONE DIAZIDE (g)

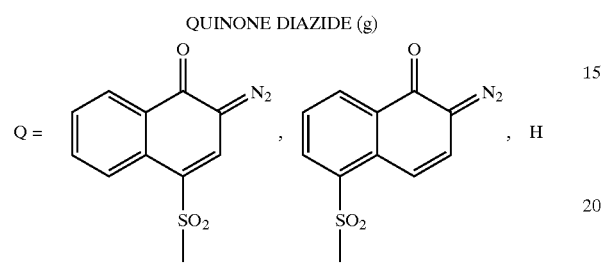

1 : 1.5 : 0.5

Synthesis 8: Quinone Diazide (h)

In a dry nitrogen gas flow, 21.22 g (0.05 mol) of TrisP-PA (trade name, produced by Honshu chemical Industry Co., Ltd.) and 29.15 g (0.125 mol) of 5-naphthoquinonediazidosulfonyl chloride were dissolved in 450 g of 1,4-dioxane, and the temperature of the solution was allowed to be room temperature. A mixture of 50 g of 1,4-dioxane and 12.65 g of triethylamine was dripped into the solution as in Synthesis 5 to yield quinone diazide (h).

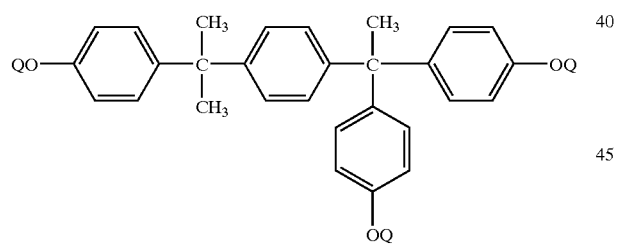

QUINONE DIAZIDE (h)

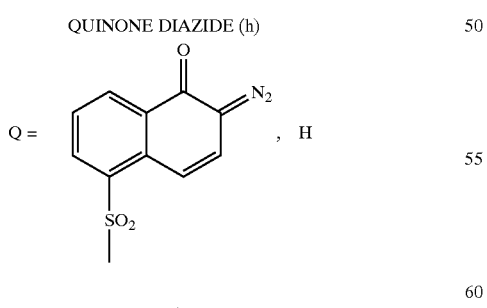

2.5 : 0.5

Compounds having a phenolic hydroxy group and solvents used in examples and comparative examples are as follows:

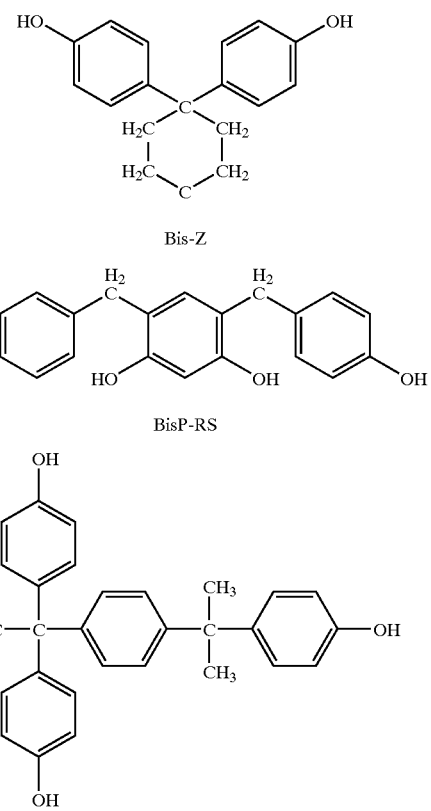

Bis-Z

BisP-RS

TrisP-PA

BIR-PC

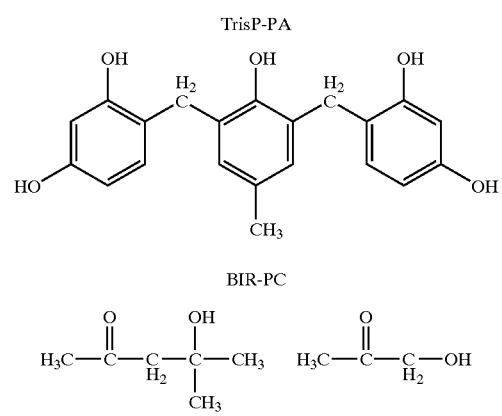

DAA   ACETOL

HMB   HMB

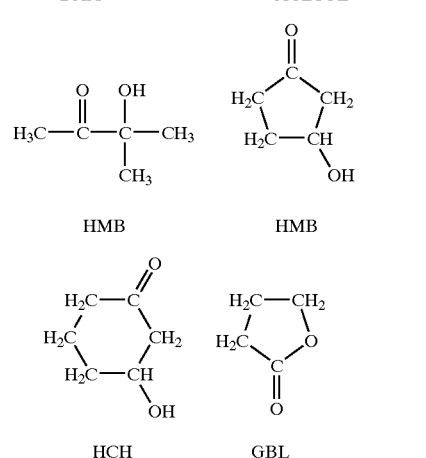

HCH   GBL

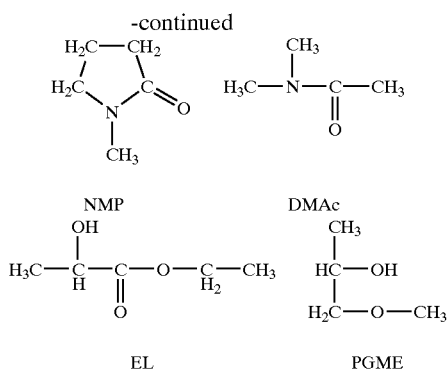

NMP DMAc EL PGME

Example 1

In a dry nitrogen gas flow, 6.02 g (0.025 mol) of 4,4'-diaminodiphenylsulfone and 1.24 g (0.005 mol) of 1,3-bis(3-aminopropyl)tetramethyldisiloxane were dissolved in 50 g of N-methyl-2-pyrrolidone (NMP). To this solution was added 21.43 g (0.03 mol) of acid anhydride (a) containing a hydroxy group with 14 g of NMP, and the mixture was allowed to react at 20° C. for 1 hour and subsequently at 50° C. for 4 hours. Then, a solution of 7.14 g (0.06 mol) of N,N-dimethylformamide dimethylacetal in 5 g of NMP was dripped to the reaction mixture, taking 10 minutes. After dripping, the mixture was stirred at 50° C. for 3 hours to react. After reaction, the resulting solution was placed in 2 L of water to precipitate a resulting polymer, and the precipitate of the polymer was collected by filtration. The polymer was dried for 20 hours in a vacuum dryer with a temperature of 80° C.

The resulting polymer in a weight of 10 g was dissolved in 15 g of diacetone alcohol (DAA) and 15 g of GBL to prepare a polymer solution. To the polymer solution were added 2 g of quinone diazide (e) and 1 g of Bis-Z (trade name, produced by Honshu Chemical Industry Co., Ltd.), being a compound containing a phenolic hydroxy group to prepare varnish A, being a photosensitive polyimide precursor composition. The varnish was applied onto a silicon wafer to form a photosensitive polyimide precursor film. The film was subjected to visual check of uniformity, measurements of thickness and 5% weight loss temperature, and foreign matter check.

Example 2

In a dry nitrogen gas flow, 15.11 g (0.020 mol) of diamine (b) containing a hydroxy group and 1.24 g (0.005 mol) of 1,3-bis(3-aminopropyl)tetramethyldisiloxane were dissolved in 50 g of N-methyl-2-pyrrolidone (NMP). To this solution was added 17.86 g (0.025 mol) of acid anhydride (a) containing a hydroxy group with 30 g of pyridine, and the mixture was allowed to react at 60° C. for 6 hour. After reaction, the solution was placed in 2 L of water to precipitate a resulting polymer, and the precipitate of the polymer was collected by filtration. The polymer was dried for 20 hours in a vacuum dryer with a temperature of 80° C.

In 60 g of DAA were dissolved 10 g of the resulting polymer, 2 g of naphthoquinone diazide (f), 2 g of BisP-RS (trace name, produced by Honshu Chemical Industry Co., Ltd.), being a compound containing a phenolic hydroxy group, and 1 g of vinyltrimethoxysilane to prepare varnish B, being a photosensitive polyimide precursor composition. The varnish was applied onto a silicon wafer to form a photosensitive polyimide precursor film. The film was subjected to visual check of uniformity, measurements of thickness and 5% weight loss temperature, and foreign matter check.

Example 3

In a dry nitrogen gas flow, 17.02 g (0.046 mol) of diamine (c) containing a hydroxy group and 1.24 g (0.005 mol) of 1,3-bis(3-aminopropyl)tetramethyldisiloxane were dissolved in 50 g of NMP. To this solution were added 7.75 g (0.025 mol) of 3,3'4,4'-diphenylethertetracarboxylic anhydride and 4.41 g (0.015 mol) of 3,3',4,4'-biphenyltetracarboxylic dianhydride with 21 g of NMP, and the mixture was allowed to react at 20° C. for 1 hour and subsequently at 50° C. for 2 hours. To this reaction mixture, 0.98 g (0.01 mol) of maleic anhydride was added and stirred at 50° C. for 2 hours. Then, a solution of 14.7 g (0.1 mol) of N,N-dimethylformamide dimethylacetal in 5 g of NMP was dripped to the mixture, taking 10 minutes. After dripping, the mixture was stirred at 50° C. for 3 hours to react. After reaction, the resulting solution was placed in 2 L of water to precipitate a resulting polymer, and the precipitate of the polymer was collected by filtration. The polymer was dried for 20 hours in a vacuum dryer with a temperature of 80° C.

In 9.2 g of acetol and 13.8 g of NMP were dissolved 10 g of the resulting polymer, 1.6 g of quinone diazide (g), and 0.8 g of TrisP-PA (trace name, produced by Honshu Chemical Industry Co., Ltd.), being a compound containing a phenolic hydroxy group, to prepare varnish C, being a photosensitive polyimide precursor composition. The varnish was applied onto a silicon wafer to form a photosensitive polyimide precursor film. The film was subjected to visual check of uniformity, measurements of thickness and 5% weight loss temperature, and foreign matter check.

Example 4

In a dry nitrogen gas flow, 6.08 g (0.025 mol) of diamine (d) containing a hydroxy group, 4.51 g (0.0225 mol) of 4,4'-diaminophenyl ether, and 0.62 g (0.0025 mol) of 1,3-bis(3-aminopropyl)tetramethyldisiloxane were dissolved in 70 g of NMP. To this solution were added 22.63 g (0.035 mol) of acid anhydride (a) containing a hydroxy group and 4.41 g (0.015 mol) of 3,3',4,4'-biphenyltetracarboxylic dianhydride with 25 g of NMP at room temperature, and the mixture was allowed to react at room temperature for 1 hour. The mixture was subsequently stirred at 50° C. for 2 hours. Then, a solution of 17.6 g (0.2 mol) of glycidyl methyl ether in 10 g of NMP was added to the mixture and stirred at 70° C. for 6 hours. After reaction, the resulting solution was placed in 2 L of water to precipitate a resulting polymer, and the precipitate of a polymer was collected by filtration. The polymer was dried for 20 hours in a vacuum dryer with a temperature of 80° C.

In 13 g of 3-hydroxy-3-methyl-2-butanone (HMB) and 30.5 g of GBL were dissolved 10 g of the resulting polymer, 2.5 g of quinone diazide (h), and 2 g of BIR-PC (trace name, produced by Asahi Organic Chemicals Industry Co., Ltd.), being a compound containing a phenolic hydroxy group, to prepare varnish D, being a photosensitive polyimide precursor composition. The varnish was applied onto a silicon wafer to form a photosensitive polyimide precursor film. The film was subjected to visual check of uniformity, measurements of thickness and 5% weight loss temperature, and foreign matter check.

Example 5

BAHF in a weight of 18.3 g (0.05 mol) was dissolved in 50 g of NMP and 26.4 (0.3 mol) of glycidyl methyl ether and cooled to −15° C., in a dry nitrogen gas flow. A solution of 14.7 g (0.050 mol) of diphenyletherdicarbonyl dichloride in 25 g of GBL was dripped into the reaction solution above such as not to increase the temperature of the reaction mixture to more than 0° C. After dripping, the reaction mixture was stirred at −15° C. for 6 hours to react. After reaction, the resulting solution was placed in 3 L of water to precipitate a resulting polymer, and the white precipitate of the polymer was collected by filtration. The collected precipitate was washed with water three times and dried in a vacuum dryer with a temperature of 80° C. for 20 hours.

In 30 g of DAA and 12 g of GBL were dissolved 10 g of the resulting polymer, 2 g of naphthoquinone diazide (f), 1 g of Bis-Z (trace name, produced by Honshu Chemical Industry Co., Ltd.), to prepare varnish E, being a photosensitive polybenzoxazole precursor composition. The varnish was applied onto a silicon wafer to form a photosensitive polybenzoxazole precursor film. The film was subjected to visual check of uniformity, measurements of thickness and 5% weight loss temperature, and foreign matter check.

Example 6

A 0.5 L flask equipped with a stirrer and a thermometer was charged with 24.82 g of 3,3'4,4'-diphenyltetracarboxylic dianhydride, 11.86 g of s-butyl alcohol, 0.40 g of triethylamine, and 110.03 g of NMP. The mixture was stirred at 60° C. for 24 hours to yield di-s-butyl 3,3',4,4'-diphenylethertetracarboxylate. After cooling the flask to 5° C., 18.08 g of thionyl chloride was dripped into the flask and allowed to react for 1 hour to yield a di-s-butyl 3,3',4,4'-diphenylethertetracarboxylate dichloride solution.

Then, a 0.5 L flask equipped with a stirrer, a thermometer, and a Dimroth condenser was charged with 47.97 g of NMP, and 4.33 g of 4,4'-diaminodiphenyl ether and 7.67 g of 3,5-diaminobenzoic acid were added into the flask. The mixture was stirred and 24.05 g of pyridine was added into the flask. Then, the di-s-butyl 3,3',4,4'-diphenylethertetracarboxylate dichloride solution was added to the flask, taking 1 hour, with temperature maintained between 0 and 5° C. and was subsequently stirred for 1 hour. The solution was placed in 4 L of water to precipitate a product. After being collected and washed, the precipitate was dried under a reduced pressure to yield a polyamide eater polymer.

In 18 g of DAA and 12 g of GBL were dissolved 10 g of the resulting polymer, 2 g of naphthoquinone diazide (f), and 1 g of Bis-Z to prepare varnish F, being a photosensitive polybenzoxazole precursor composition. The varnish was applied onto a silicon wafer to form a photosensitive polybenzoxazole precursor film. The film was subjected to visual check of uniformity, measurements of thickness and 5% weight loss temperature, and foreign matter check.

Example 7

In a dry air flow, 64.2 g of pyridine was added to a 2 L, 4-neck flask charged with 52.3 g (0.24 mol) of pyromellitic dianhydride, 51.5 g (0.16 mol) of 3,3',4,4'-benzophenonetetracarboxylic dianhydride, 62.4 g (0.48 mol) of 2-hydroxyethyl methacrylate, 14.7 g (0.32 mol) of ethanol, and 320 g of GBL, with water-cooling and stirring. After heat generation was completed, the flask was cooled to room temperature and allowed to stand for 16 hours. Then, a solution of 166 g of dicyclohexylcarbodiimide in 120 g of GBL was added into the flack, taking 40 minutes with water-cooling and stirring, and subsequently a suspension of 74.5 (0.372 mol) of 4,4'-diaminodiphenyl ether in 150 g of GBL was added, taking 60 minutes with water-cooling and stirring. After stirring for 2 hours, 30 g of ethanol was added into the flask, followed by stirring for 1 hour. Then, 250 g of N,N'-dimethylacetamide (DMAc) and 400 g of tetrahydrofuran were added and precipitate was removed by filtration. The resulting solution was placed in 15 L of ethanol to precipitate a resulting polymer. The precipitate was separated out by filtration and vacuum-dried to yield a polymer powder. The powder was dissolved in 15 g of DAA and 15 g of NMP to prepare varnish G, being a photosensitive polyimide precursor composition. The varnish was applied onto a silicon wafer to form a photosensitive polyimide precursor film. The film was subjected to visual check of uniformity, measurements of thickness and 5% weight loss temperature, and foreign matter check.

Example 8

Varnish H, being a photosensitive polyimide precursor composition, was prepared in an identical manner to Example 1 except that the solvent for the varnish was replaced with 10 g of 3-hydroxycyclopentanone (HCP) and 20 g of DMAc. The varnish was applied onto a silicon wafer to form a photosensitive polyimide precursor film. The film was subjected to visual check of uniformity, measurements of thickness and 5% weight loss temperature, and foreign matter check.

Example 9

Varnish I, being a photosensitive polyimide precursor composition, was prepared in an identical manner to Example 3 except that the solvent for the varnish was replaced with 15 g of 3-hydroxycyclohexane (HCH) and 15 g of GBL. The varnish was applied onto a silicon wafer to form a photosensitive polyimide precursor film. The film was subjected to visual check of uniformity, measurements of thickness and 5% weight loss temperature, and foreign matter check.

Example 10

In a dry nitrogen gas flow, 13.60 g (0.018 mol) of diamine (b) containing a hydroxy group and 0.50 g (0.002 mol) of 1,3-bis(3-aminopropyl)tetramethyldisiloxane were dissolved in 50 g of NMP. To this solution was added 17.86 g (0.025 mol) of acid anhydride (a) containing a hydroxy group with 30 g of pyridine, and the mixture was allowed to react at 60° C. for 2 hour. Then, 0.59 g (0.005 mol) of 4-ethynylaniline, acting as a end cap compound, was added and allowed to react at 60° C. for 2 hours. After reaction, the resulting solution was placed in 2 L of water to precipitate a resulting polymer, and the precipitate of the polymer was collected by filtration. The polymer was dried for 20 hours in a vacuum dryer with a temperature of 80° C.

In 5 g of acetol, 10 g of DAA, and 15 g GBL were dissolved 10 g of the resulting polymer, 2 g of naphthoquinone diazide (f), 2 g of BisP-RS, being a compound containing a phenolic hydroxy group, and 1 g of vinyltrimethoxysilane to prepare varnish J, being a photosensitive polyimide precursor composition. The varnish was applied onto a silicon wafer to form a photosensitive polyimide precursor film. The film was subjected to visual check of uniformity, measurements of thickness and 5% weight loss temperature, and foreign matter check.

Example 11

Varnish K, being a photosensitive polyimide precursor composition, was prepared in an identical manner to Example 10 except that the end cap compound, namely, 0.59 g of 4-ethynylaniline was replaced with 0.54 g (0.005 mol) of 3-aminophenol and that the solvent for the varnish was replaced with 10 g of HMB, 5 g of ethyl lactate (EL), and 15 g of NMP. The varnish was applied onto a silicon wafer to form a photosensitive polyimide precursor film. The film was subjected to visual check of uniformity, measurement of thickness, and foreign matter check. Furthermore, 5% weight loss temperature was measured as above.

Comparative Example 1

Varnish L, being a photosensitive polyamide precursor composition, was prepared in an identical manner to Example 1 except that the solvent for the varnish was replaced with 30 g NMP. The varnish was applied onto a silicon wafer to form a photosensitive polyimide precursor film. The film was subjected to visual check of uniformity, measurements of thickness and 5% weight loss temperature, and foreign matter check.

Comparative Example 2

Varnish M, being a photosensitive polyamide precursor composition, was prepared in an identical manner to Example 2 except that the solvent for the varnish was replaced with 60 g GBL. The varnish was applied onto a silicon wafer to form a photosensitive polyimide precursor film. The film was subjected to visual check of uniformity, measurements of thickness and 5% weight loss temperature, and foreign matter check.

Comparative Example 3

Varnish N was prepared in an identical manner to Example 3 except that the solvent for the varnish was replaced with 2.3 g of DMAc and 20.7 g of propylene glycol monomethyl ether. The varnish was applied onto a silicon wafer to form a photosensitive polyimide precursor film. The film was subjected to visual check of uniformity, measurements of thickness and 5% weight loss temperature, and foreign matter check.

Comparative Example 4

Varnish O, being a photosensitive polyimide precursor composition, was prepared in an identical manner to Example 4 except that the solvent for the varnish was replaced with 30 g EL. The varnish was applied onto a silicon wafer to form a photosensitive polyimide precursor film. The film was subjected to visual check of uniformity, measurements of thickness and 5% weight loss temperature, and foreign matter check.

Comparative Example 5

To 270 g of DAA was added 90 g of meta para cresol novolac resin (meta cresol/para cresol: 55/45, molecular weight in terms of polystyrene: 10,000), 18 g of 2,3,4,4'-tetrahydroxybenzophenone naphthoquinonediazido ester (4NT-350 produced by Toyo Gosei Co., Ltd.), 0.1 g of surfactant (FC-431 produced by Sumitomo 3M Ltd.) to prepare positive photosensitive resist P. The resist was applied onto a silicon wafer to form a photosensitive resist film. The film was subjected to visual check of uniformity, measurement of thickness, and foreign matter check. The resist was prebaked to a thickness of about 3 μm, and the 5% weight loss temperature was measured as above, but curing was omitted.

Table 1 shows the results.

TABLE 1

|  | Varnish | Solvent (wt %) | | | Film Appearance | Foreign matter (pcs/cm$^2$) | Thickness (μm) | Range (μm) | 5% weight loss temperature ° C. |
|---|---|---|---|---|---|---|---|---|---|
| Example 1 | A | DAA (50 wt %) | GBL (50 wt %) | | Good | 0.16 | 7.1 | 0.07 | 522 |
| Example 2 | B | DAA (100 wt %) | | | Good | 0.42 | 7.0 | 0.19 | 510 |
| Example 3 | C | Acetol (30 wt %) | NMP (60 wt %) | | Good | 0.00 | 7.2 | 0.07 | 515 |
| Example 4 | D | HMB (30 wt %) | GBL (70 wt %) | | Good | 0.05 | 6.8 | 0.10 | 506 |
| Example 5 | E | ADD (71 wt %) | GBL (29 wt %) | | Good | 0.14 | 7.0 | 0.13 | 442 |
| Example 6 | F | DAA (60 wt %) | GBL (40 wt %) | | Good | 0.20 | 7.0 | 0.10 | 497 |
| Example 7 | G | DAA (50 wt %) | NMP (50 wt %) | | Good | 0.18 | 7.0 | 0.20 | 513 |
| Example 8 | H | HCP (33 wt %) | DMAc (67 wt %) | | Good | 0.25 | 7.1 | 0.15 | 520 |
| Example 9 | I | HCH (50 wt %) | GBL (50 wt %) | | Good | 0.22 | 7.2 | 0.23 | 504 |
| Example 10 | J | Acetol (17 wt %) | DAA (33 wt %) | GBL (50 wt %) | Good | 0.14 | 6.8 | 0.18 | 512 |
| Example 11 | K | HMB (33 wt %) | EL (17 wt %) | NMP (50 wt %) | Good | 0.10 | 7.0 | 0.15 | 498 |
| Comparative example 1 | L | NMP (100 wt %) | | | Good | 0.06 | 6.9 | 0.48 | 517 |
| Comparative example 2 | M | GBL (100 wt %) | | | Good | 0.24 | 7.3 | 0.63 | 514 |
| Comparative example 3 | N | DMAc (10 wt %) | PGME (90 wt %) | | Striation | 3.98 | Not measurable | Not measurable | 510 |
| Comparative example 4 | O | EL (100 wt %) | | | Striation | 5.20 | Not measurable | Not measurable | 500 |
| Comparative example 5 | P | DAA (100 wt %) | | | Good | 0.05 | 2.0 | 0.03 | 320 |

What is claimed is:

1. A photosensitive resin precursor composition comprising:
   (a) a heat resistant resin precursor polymer;
   (b) a radiation sensitive compound; and
   (c) a solvent expressed by formula (1):

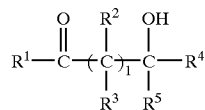
(1)

wherein $R^1$ represents an alkyl group having a carbon number in the range of 1 to 3, $R^2$, $R^3$, $R^4$, and $R^5$ are each selected from among hydrogen and alkyl groups having carbon numbers in the range of 1 to 3, and 1 represents an integer in the range of 0 to 3.

2. A photosensitive resin precursor composition comprising:
   (a) a heat resistant resin precursor polymer;
   (b) a radiation sensitive compound; and
   (c) a solvent expressed by formula (2);

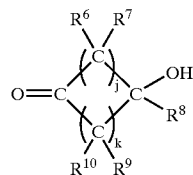
(2)

wherein $R^6$ to $R^{10}$ are each selected from among hydrogen and alkyl groups having carbon numbers in the range of 1 to 3, and j and k are each an integer in the range of 0 to 3 and satisfy the relationship $j+k \geqq 2$.

3. A photosensitive resin precursor composition according to claim 1 or 2, wherein the heat resistant resin precursor polymer comprises a structural unit expressed by formula (3):

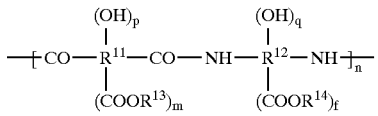
(3)

wherein $R^{11}$ and $R^{12}$ are each an organic group having a carbon number of at least 2 and a valence in the range of 2 to 8, $R^{13}$ and $R^{14}$ are each selected from among hydrogen and organic groups having a carbon number in the range of 1 to 20, n is in the range of 10 to 100000, m and f are each an integer in the range of 0 to 2, and p and q are each an integer in the range of 0 to 4 and satisfy the relationship p+q>0.

4. A photosensitive resin precursor composition according to claim 1 or 2, wherein the radiation sensitive compound is a quinone diazide.

5. A photosensitive resin precursor composition according to claim 1 or 2, wherein the heat resistant resin precursor polymer comprises a structural unit expressed by formula (3) and wherein the radiation sensitive compound is a quinone diazide:

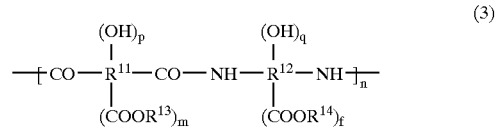
(3)

wherein $R^{11}$ and $R^{12}$ are each an organic group having a carbon number of at least 2 and a valence in the range of 2 to 8, $R^{13}$ and $R^{14}$ are each selected from among hydrogen and organic groups having a carbon number in the range of 1 to 20, n is in the range of 10 to 100000, m and f are each an integer in the range of 0 to 2, and p and q are each an integer in the range of 0 to 4 and satisfy the relationship p+q>0.

6. A photosensitive resin precursor composition according to claim 1, wherein the heat resistant resin precursor polymer comprises a structural unit expressed by formula (4):

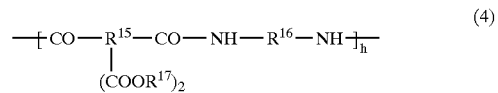
(4)

wherein $R^{15}$ represents an organic group having a carbon number of at least 2 and a valence in the range of 2 to 8, $R^{16}$ represents an organic group having a carbon number of at least 2 and a valence in the range of 2 to 6, $R^{17}$ represents an organic group having a carbon-carbon unsaturated double bond capable of dimerization or polymerization by actinic radiation and having a carbon number in the range of 1 to 30, and h is in the range of 10 to 100000.

7. A photosensitive resin precursor composition according to claim 3, wherein $R^{11}(COOR^{13})_m(OH)_p$ in formula (3) is expressed by formula (5):

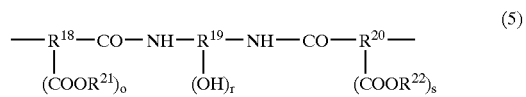
(5)

wherein $R^{18}$ and $R^{20}$ each represent an organic group having a carbon number in the range of 2 to 20 and a valence in the range of 2 to 4, $R^{19}$ represents an organic group having a carbon number in the range of 3 to 20 and a valence in the range of 3 to 6 and having a hydroxy group, $R^{21}$ and $R^{22}$ are each selected from among hydrogen and organic groups having carbon numbers in the range of 1 to 20, o and s each represent an integer in the range of 0 to 2, and r represents an integer in the range of 1 to 4.

8. A photosensitive resin precursor composition according to claim 3, wherein $R^{12}(COOR^{14})_f(OH)_q$ in formula (3) is expressed by formula (6):

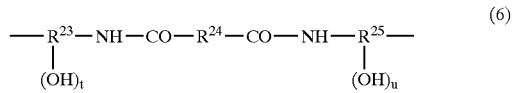
(6)

wherein $R^{23}$ and $R^{25}$ each represent an organic group having a carbon number in the range of 2 to 20 and a valence in the range of 3 to 4 and having a hydroxy group, $R^{24}$ represents a divalent organic group having a carbon number in the range of 2 to 30, and t and u each represent an integer of 1 or 2.

9. A photosensitive resin precursor composition according to claim 3, wherein $R^{12}(COOR^{14})_f(OH)_q$ in formula (3) is expressed by formula (7):

$$—R^{26}—CO—NH—R^{27}—NH—CO—R^{28}— \atop (OH)_v \qquad (7)$$

wherein $R^{26}$ and $R^{28}$ each represent a divalent organic group having a carbon number in the range of 2 to 20, $R^{27}$ represents an organic group having a carbon number in the range of 3 to 20 and a valence in the range of 3 to 6 and having a hydroxy group, and v represents an integer in the range of 1 to 4.

10. A photosensitive resin precursor composition according to claim 3, wherein $R^{12}(COOR^{14})_f(OH)_q$ in formula (3) is expressed by formula (8):

$$—R^{29}—CO—NH—R^{30}— \atop (OH)_w \qquad (8)$$

wherein $R^{29}$ represents a divalent organic group having a carbon number in the range of 2 to 20, $R^{30}$ represents an organic group having a carbon number in the range of 3 to 20 and a valence in the range of 3 to 6 and having a hydroxy group, and w represents an integer in the range of 1 to 4.

11. A photosensitive resin precursor composition according to claim 3, wherein m, f, and p in formula (3) are 0.

12. A photosensitive resin precursor composition according to claim 3, wherein, in formula (3), m is 2 and f is 1 or 2.

* * * * *